US006949158B2

(12) United States Patent
Ball et al.

(10) Patent No.: US 6,949,158 B2
(45) Date of Patent: Sep. 27, 2005

(54) USING BACKGRIND WAFER TAPE TO ENABLE WAFER MOUNTING OF BUMPED WAFERS

(75) Inventors: Michael B. Ball, Boise, ID (US); Jose L. Sanchez, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 108 days.

(21) Appl. No.: 09/854,759

(22) Filed: May 14, 2001

(65) Prior Publication Data

US 2002/0166625 A1 Nov. 14, 2002

(51) Int. Cl.[7] .............................................. H01L 21/463

(52) U.S. Cl. ....................... 156/154; 156/247; 156/285; 156/344; 438/459; 438/464

(58) Field of Search ................................ 156/153, 154, 156/247, 285, 344; 438/459, 460, 464, 977

(56) References Cited

U.S. PATENT DOCUMENTS

| | | | | | |
|---|---|---|---|---|---|
| 4,753,049 | A | | 6/1988 | Mori | |
| 5,035,087 | A | | 7/1991 | Nishiguchi et al. | |
| 5,476,566 | A | | 12/1995 | Cavasin | |
| 5,632,667 | A | | 5/1997 | Earl et al. | |
| 5,679,060 | A | | 10/1997 | Leonard et al. | |
| 5,827,112 | A | | 10/1998 | Ball | |
| 5,883,522 | A | | 3/1999 | O'Boyle | |
| 6,024,631 | A | | 2/2000 | Piper | |
| 6,054,015 | A | | 4/2000 | Brunelli et al. | |
| 6,060,373 | A | * | 5/2000 | Saitoh | 438/459 |
| 6,112,735 | A | | 9/2000 | Farnworth | |
| 6,112,740 | A | | 9/2000 | Wark et al. | |
| 6,120,360 | A | | 9/2000 | Ball et al. | |
| 6,146,256 | A | | 11/2000 | Joo | |
| 6,146,259 | A | | 11/2000 | Zuniga et al. | |
| 6,146,260 | A | | 11/2000 | Yi | |
| 6,149,500 | A | | 11/2000 | Takahashi et al. | |
| 6,149,505 | A | | 11/2000 | Brown et al. | |
| 6,149,506 | A | | 11/2000 | Duescher | |
| 6,149,507 | A | | 11/2000 | Lee et al. | |
| 6,152,808 | A | | 11/2000 | Moore | |
| 6,162,703 | A | | 12/2000 | Muntifering et al. | |
| 6,338,980 | B1 | * | 1/2002 | Satoh | 438/106 |
| 6,342,434 | B1 | * | 1/2002 | Miyamoto et al. | 438/464 |
| 6,478,918 | B2 | * | 11/2002 | Bennett et al. | 156/248 |
| 2002/0068453 | A1 | * | 6/2002 | Grigg et al. | 438/690 |

* cited by examiner

*Primary Examiner*—John T. Haran
(74) *Attorney, Agent, or Firm*—TraskBritt

(57) ABSTRACT

A method and apparatus are disclosed for mounting a wafer on a mount and thinning the wafer. The wafer includes a front surface having bumps with an adhesive tape having a backing attached thereto and a back surface. The front surface of the wafer is mounted facedown on a suction surface with the backing of the adhesive tape abutting the surface. The wafer is then suctioned, after which the back surface of the wafer undergoes a grinding process to thin the wafer. Since the backing attached to the bumps on the wafer is substantially planar and sits substantially flat on the suction surface of the wafer mount, the force exerted on the wafer from the thinning process does not overcome the suction force holding the wafer on the wafer mount. Thus, the bumped wafer may be thinned without damaging the bumps and the active surface of the wafer.

53 Claims, 5 Drawing Sheets

USING BACKGRIND WAFER TAPE TO ENABLE WAFER MOUNTING OF BUMPED WAFERS

BACKGROUND OF THE INVENTION

1. Field of the Invention

The present invention relates to a method and apparatus for mounting and thinning a wafer. In particular, the present invention relates to a method and apparatus for mounting a bumped wafer to a wafer mounting chuck and thinning the wafer to a predetermined thickness.

2. State of the Art

Typically, in a manufacturing process, a plurality of integrated circuits is simultaneously patterned and defined on the front surface of a single silicon wafer. The circuits are generally aligned in rows and columns in an orthogonal format. After the integrated circuits are fully defined, the wafer is diced by a singulation machine along lines between the rows and columns, separating the wafer into a plurality of individual integrated circuit dice. The integrated circuit dice can then be secured within individual packages and/or incorporated into electronic devices.

In the typical manufacturing process, the silicon wafer is sliced from a generally cylindrical ingot. The wafer is at first sliced sufficiently thick so as not to warp or break during the various manufacturing processes. However, in some instances, the desired thickness for the finished dice is less than the initial thickness of the sliced wafer. Therefore, after the integrated circuit patterns are formed on the wafer, it has been necessary to grind the back surface of the wafer to reduce its thickness as desired for the individual integrated circuit die.

Grinding machines for grinding down the back surfaces of silicon wafers are known in the art. The known machines have chuck tables for securing a plurality of wafers in position to be ground by one or more grinding wheels. Examples of such grinding machines are illustrated in U.S. Pat. No. 5,679,060 (Leonard), U.S. Pat. No. 4,753,049 (Mori), U.S. Pat. No. 5,632,667 (Earl), and U.S. Pat. No. 5,035,087 (Nishiguchi).

Currently available wafer processing systems are unsatisfactory, particularly for grinding wafers after the contact pads of the integrated circuits thereon are bumped, known as bumped wafers. Recently, the market demands the thinning of wafers to about 6 mils or less for chips utilized in ultra-compact applications such as in cell phones. For example, see U.S. Pat. No. 5,476,566 (Cavasin), which discloses a method for thinning wafers by adhesively attaching the wafers to a supporting substrate, but does not disclose thinning wafers after being bumped. Also, U.S. Pat. No. 6,162,703 (Muntifering et al.), assigned to the assignee of the present invention, discloses a method for thinning and singulating dice from an unbumped wafer by adhesively attaching the unbumped wafer to a table and precutting notches in the unbumped wafer prior to the thinning thereof. However, for bumped wafers, it is necessary to thin the wafer after bumping because, currently, the wafer must be at least 12 mils thick to undergo the bumping process without the likelihood of damage thereto. Further, it is important that the wafer be held tightly in place during the thinning process, typically with a vacuum chuck.

Vacuum chucks include a series of apertures in the surface of the chuck to which a vacuum source is connected. The suction created between the surface of the chuck and the bottom of the wafer securely holds the wafer in place. For example, see U.S. Pat. No. 6,120,360, assigned to the assignee of the present invention, which discloses a vacuum chuck made for securing to the planar face surface of a wafer. However, the vacuum chuck is segmented into quarters and also requires the wafer to be quartered, resulting in additional process steps and potential for error in handling four times the number of wafer parts per wafer.

Although vacuum chucks perform very well for wafers having a planar face surface through which air cannot pass, such vacuum chucks will not work well for a bumped wafer. Specifically, the required suction force between the surface of the chuck and the active surface of the wafer cannot be achieved since the suctioned air will pass through the gap provided by the bumps formed on the bond pads of the integrated circuits formed on the surface of the wafer. To overcome such problems, vacuum chucks for bumped wafers are typically made to provide the suction on the active surface's periphery where there are no bumps. However, such vacuum chucks do not provide the necessary suction at the wafer's periphery for effectively holding a bumped wafer for the thinning thereof because there is not enough surface area proximate the wafer's periphery without the integrated circuits and bumps thereon. As a result, it has been suggested to increase the area proximate the wafer's periphery without the integrated circuits and bumps formed on the bond pads thereof to provide greater suction on the wafer. However, this would unacceptably limit the number of bumped dice per wafer, thereby resulting in a reduction of yield.

Therefore, it would be advantageous to provide a method and apparatus for thinning bumped wafers that provide the necessary area for suction without limiting the number of bumped dice on the wafer.

SUMMARY OF THE INVENTION

The present invention relates to a method and apparatus for mounting a bumped wafer. The present invention further relates to a method and apparatus for mounting a bumped wafer to a wafer mounting chuck and thinning the wafer.

In a preferred embodiment of the present invention, the wafer includes a front surface and a back surface, the front surface including conductive bumps on the bond pads of the integrated circuits located thereon. The present invention includes an adhesive tape having an adhesive and a backing, the adhesive of the adhesive tape attaching the tape to the front surface of the wafer and, particularly, to the bumps on the bond pads of the integrated circuits located on the front surface of the wafer. According to the present invention, the adhesive and the tape attaches to the bumps so that an outer surface of the backing of the tape is substantially planar.

With the adhesive tape attached to the front surface of the wafer, the wafer is mounted, facedown, to a wafer mounting chuck. The wafer mounting chuck includes a suction surface with apertures therein which communicate a suction force to the wafer. The suction surface is configured to hold the wafer by the suction force applied thereto and, particularly, to hold the outer surface of the adhesive tape which is adhesively attached to the wafer using the suction force applied thereto. Thus, the outer surface of the adhesive tape provides a large surface area for holding the wafer via the suction force.

Once the wafer is suctioned facedown to the wafer mounting chuck, the wafer is ready for a thinning process. In particular, the wafer is thinned by removing material from the back surface of the wafer by grinding or chemical mechanical polishing. In this manner, bumped wafers may be thinned to less than 12 mils and, preferably, between about 6 mils and about 12 mils. After the thinning process, a wafer mount tape is applied to the back surface of the wafer. The adhesive tape is then removed from the active surface of the wafer with the aid of de-tape. The de-tape has a stronger adhesive than that of the adhesive tape so that the de-tape may be applied to an end portion of the adhesive tape for peeling the adhesive tape from the front surface of the wafer. The wafer may then undergo singulation or, rather, the wafer may be segmented into separate integrated circuit dice and/or a plurality of integrated circuit dice.

In an aspect of the present invention, the adhesive tape overlying the bumps on the bond pads of the integrated circuits and the front surface of the wafer provides an outer surface that is substantially planer so that-the outer surface of the tape is suctionable. Further, the suction force is applied to substantially the whole outer surface of the backing in the desired areas so that the force exerted on the wafer from the thinning process does not overcome the suction force holding the wafer on the wafer mounting chuck. In this manner, the bumped wafer may be thinned to a desired level or an ultra thin level without damaging the bumps on the bond pads and the integrated circuits formed on the front surface of the wafer.

Another aspect of the invention provides that the bumped wafer be thinned to less than 12 mils thick. Since wafers being bumped are currently required to be at least 12 mils thick, it is necessary for the bumps to be formed on the wafer before thinning the wafer to the desired thickness between the preferred range of about 6 mils to about 12 mils.

Other features and advantages of the present invention will become apparent to those of skill in the art through a consideration of the ensuing description, the accompanying drawings and the appended claims.

BRIEF DESCRIPTION OF THE SEVERAL VIEWS OF THE DRAWINGS

While the specification concludes with claims particularly pointing out and distinctly claiming that which is regarded as the present invention, the advantages of this invention may be ascertained from the following description of the invention when read in conjunction with the accompanying drawings.

FIGS. 1 through 9 illustrate a method and apparatus for mounting a wafer having bumps to a wafer mounting chuck and then thinning the wafer, in which:

FIG. 1 is a simplified top plan view of an active surface of a wafer according to the present invention;

FIG. 2 is a simplified and enlarged partial cross-sectional view of the wafer depicted in FIG. 1 along line 2, according to the present invention;

FIG. 3 is a simplified and enlarged partial cross-sectional view of a wafer and an adhesive tape facing each other in an unattached position according to the present invention;

FIG. 4 is a simplified and enlarged partial cross-sectional view of a wafer and an adhesive tape facing each other in an attached position according to the present invention;

FIG. 5 is partially a simplified cross-sectional view of a wafer facing a wafer mounting chuck in an unmounted position and partially a diagram of a mounting apparatus and a vacuum integrated with the wafer mounting chuck, according to the present invention;

FIG. 6 is partially a simplified cross-sectional view of a wafer facing a wafer mounting chuck in a mounted position and partially a diagram of a mounting apparatus and a vacuum integrated with the wafer mounting chuck, according to the present invention;

FIG. 7 is a simplified cross-sectional view of a wafer positioned on a wafer mounting chuck with a wafer mount tape being applied on the back surface of the wafer;

FIG. 8 is a simplified cross-sectional view of the adhesive tape being removed from the front surface of the wafer with the wafer mount tape maintained on the back surface of the wafer, and FIG. 9 is a simplified cross-sectional view of a wafer having the wafer mount tape on the back surface of the wafer and a dicing apparatus for singulating the wafer according to the present invention.

DETAILED DESCRIPTION OF THE INVENTION

Figure 1:
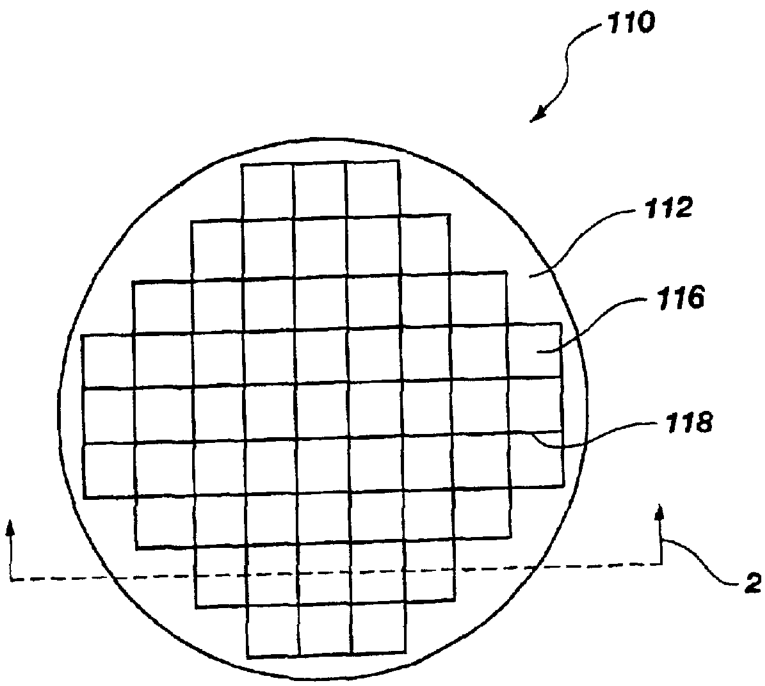

Preferred embodiments of the present invention will be hereinafter described with reference to the accompanying drawings. It should be understood that the illustrations are not meant to be actual views of any particular apparatus and/or method, but are merely idealized representations which are employed to more clearly and fully depict the present invention than would otherwise be possible. Additionally, elements and features common between the figures retain the same numerical designation.

Depicted in drawing FIGS. 1 through 7 are a method and apparatus for mounting a bumped wafer and then thinning the bumped wafer. Turning to drawing FIG. 1, there is illustrated a top plan view of a wafer 110. The wafer 110 includes a front surface 112 and a back surface 114 (see FIG. 2). The front surface 112 of the wafer 110 includes individual integrated circuits separated by street indices or streets 118. The street indices 118 are arranged in horizontal rows and vertical columns and define individual integrated circuit dice 116 in the wafer 110. The wafer 110 preferably is made of silicon or gallium arsenide, although any semiconductor material may be used such as germanium, lead sulfide and silicon carbide.

Figure 2:
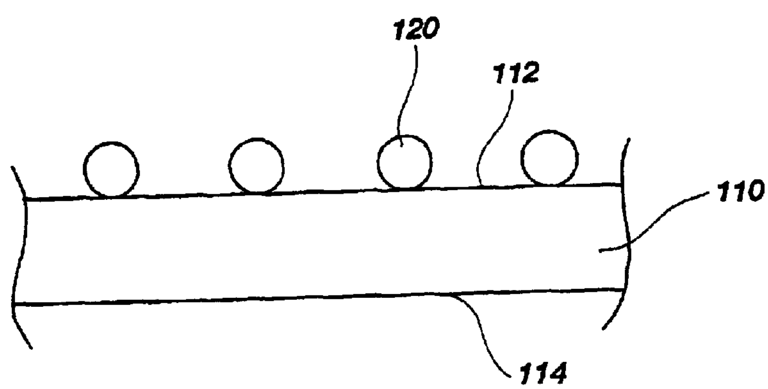

Depicted in drawing FIG. 2 is a partial cross-sectional view of the wafer 110 taken along line 2 in drawing FIG. 1. On the front surface 112 of the wafer 110 there are conductive bumps 120 on the bond pads of the integrated circuits made to ultimately provide external interconnections for the integrated circuits in each of the individual integrated circuit dice 116. The conductive bumps 120 are preferably ball shaped, but may be shaped as columns and/or studs. The conductive bumps 120 may be formed of any known conductive material or alloy thereof, such as solder, lead, tin, copper, silver and/or gold and conductive polymers and/or conductive composites. The conductive bumps 120 are typically bonded to the wafer 110 through a reflow process at a predetermined temperature dependent upon the material properties of the conductive bumps 120. Currently, in order for the wafer 110 to successfully undergo the process steps of bonding the conductive bumps 120 thereto, the wafer should be at least 12 mils thick. Therefore, according to the present invention, it is necessary for the bumps to be formed on the wafer before thinning the wafer to the desired thickness, currently, such as between about 6 mils and about 12 mils, although the wafer may thinned to any desired thickness less than 6 mils.

Figure 3:
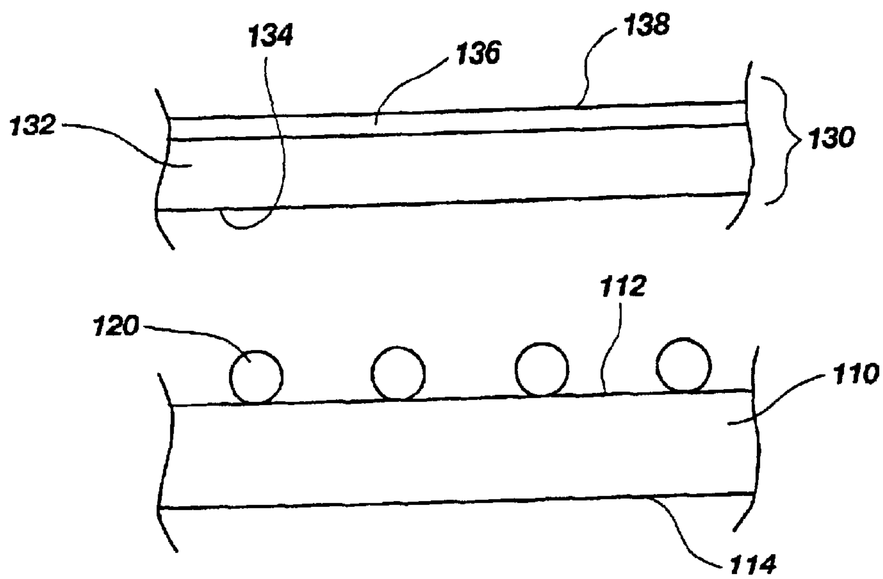

Depicted in drawing FIG. 3 is the wafer 110 and an adhesive tape 130, such as backgrind tape, prior to being in an attached position. The adhesive tape 130 includes an adhesive 132 with an adhesive surface 134 and a backing 136 with an outer surface 138. The outer surface 138 of the backing 136 is nonadhesive. The adhesive 132 used for the adhesive tape 130 may be, but is not limited to, a pressure sensitive silicone adhesive, acrylic adhesive, UV curable adhesive, and/or any adhesive that allows the tape to be easily removed without damaging the wafer 110. It is also desirable for the adhesive 132 on the adhesive tape 130 to leave a nonconductive ash when it oxidizes or bums to prevent any potential problems of electrical connections with any portion of the wafer 110 and the individual integrated circuit dice 116. The backing 136 for the adhesive tape 130 may be of a polymer material or paper or the like. As such, the backing 136 may be rigid or flexible so long as the backing 136 is substantially planar for mounting the wafer 110 (discussed further below). Further, the backing 136 should be of sufficient strength so that it will not easily tear.

Figure 4:
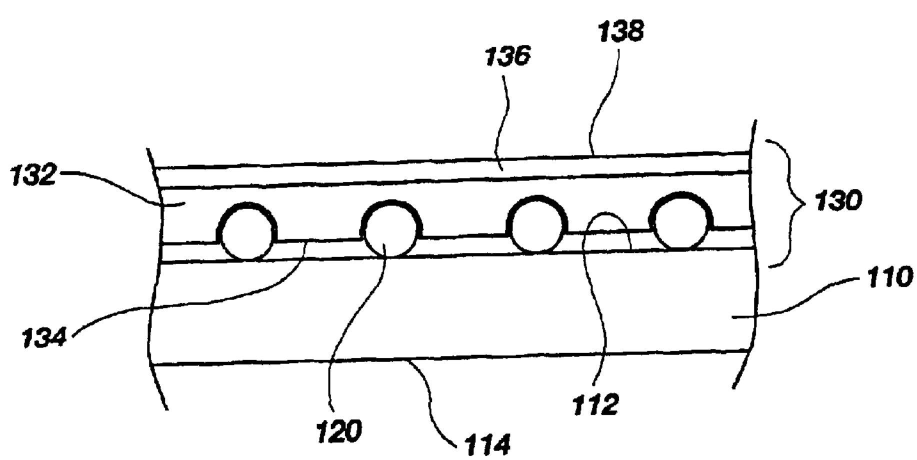

Referring to drawing FIG. 4, the adhesive tape 130 is adhesively placed and attached to the conductive bumps 120 to overlie the front surface 112 of the wafer 110. The adhesive tape 130 is preferably substantially the size of the wafer 110 so that it overlies each of the conductive bumps 120. The adhesive tape 130 may also overlie portions of the wafer 110 without the conductive bumps 120 thereon, namely a periphery of the front surface 112, to provide protection of the front surface 112. Such positioning of the adhesive tape 130 may be accomplished manually and/or by machinery.

As depicted in drawing FIG. 4, the adhesive 132 attached to the conductive bumps 120 may conform to and/or about the conductive bumps 120 so that the adhesive 132 attaches between about 10% and about 60% of the bumps' surface area. The range of necessary surface area for sufficient attaching depends on the type of adhesive 132 employed, as known in the art. As such, it is desired that the adhesive 132 has sufficient strength to withstand a grinding process (discussed further below). Further, an important feature of the present invention is that the adhesive tape 130 conforms to the conductive bumps 120 in a manner that allows the outer surface 138 of the backing 136 to be substantially planar.

Figure 5:
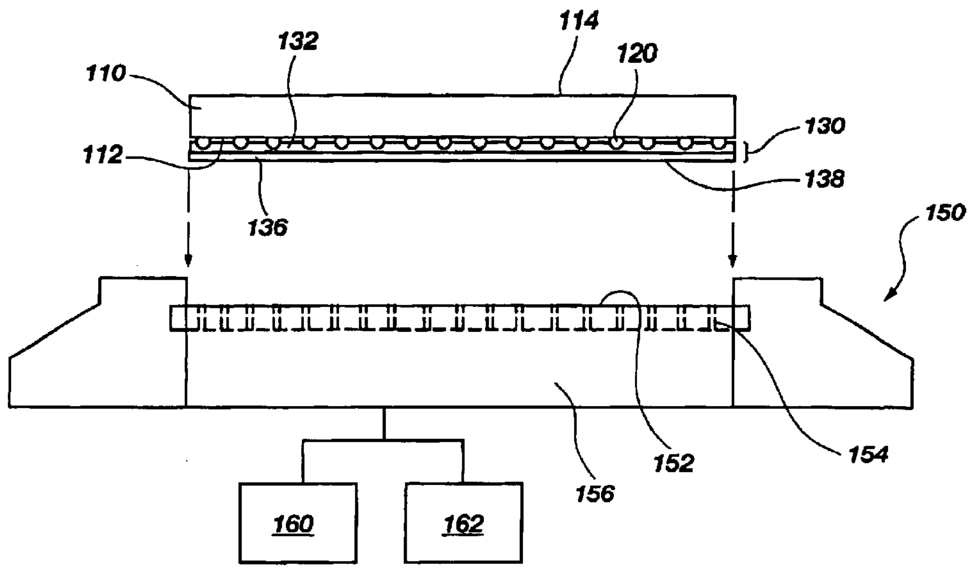

Referring to drawing FIG. 5, there is shown a cross-sectional view of the wafer 110 and a wafer mounting chuck 150 prior to the wafer 110 being mounted thereon. As shown, the wafer 110 is inverted with its front surface 112 facedown so that the substantially planar outer surface 138 of the backing 136 of the adhesive tape 130 is facing the wafer mounting chuck 150. The wafer mounting chuck 150 includes a suction surface 152 on which the substantially planar outer surface 138 is to be attached or mounted. The suction surface 152 includes apertures 154 that communicate with the chamber 156 in the wafer mounting chuck 150. The chamber 156 in turn communicates with a vacuum 160 which provides suction at the suction surface 152. The vacuum 160 is integrated with a mounting apparatus 162 to which the wafer mounting chuck 150 is connected. The number of apertures 154 in the suction surface 152 may vary depending on the required suction involved, which may be determined by one of ordinary skill in the art. For example, a plurality of closely spaced, minuscule apertures 154 having small diameters may be provided. Alternatively, the apertures 154 may be larger and more spread out.

Figure 6:
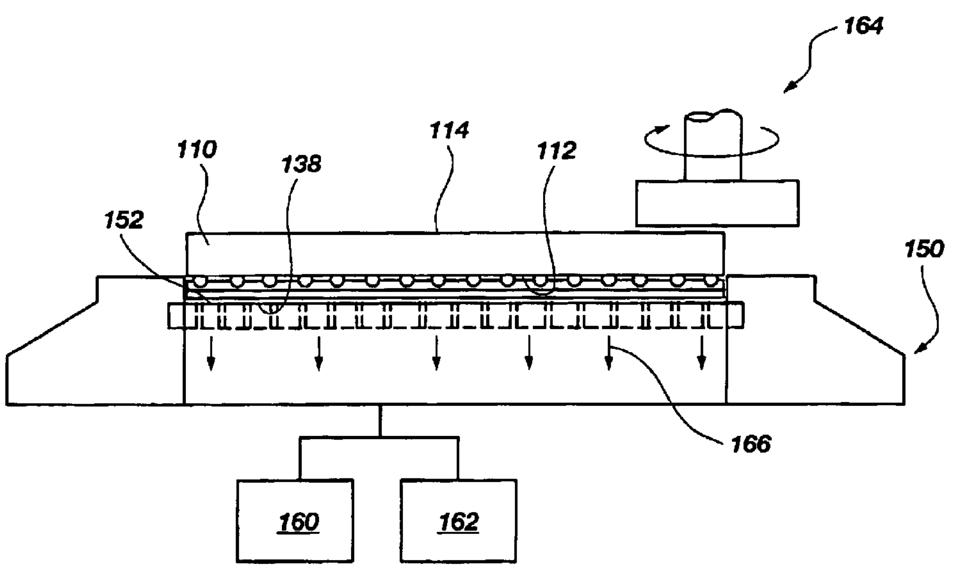

As shown in drawing FIG. 6, the wafer 110 with its front surface 112 facedown is placed on the wafer mounting chuck 150 to be suctioned thereto. In particular, the substantially planar outer surface 138 sits flat against the suction surface 152 of the wafer mounting chuck 150 so that the wafer 110 may be suctioned to the mounting apparatus 162 via the vacuum 160. In this manner, the planarity of the outer surface 138 of the adhesive tape 130 allows the vacuum 160 to provide a suction force 166 through the apertures 154 that sufficiently secures the wafer 110 to the suction surface 152 without substantial leakage affecting the suction force 166. In the suctioned position, the back surface 114 of the wafer 110 faces upward in an exposed position.

The back surface 114 of the wafer 110 is then processed through a normal back-grind or back-lap process to thin the wafer 110 to a desired thickness by a grinder 164. The grinder 164, as depicted in drawing FIG. 6, is only intended to represent a generic wafer back-grinding tool. In the grinding operation, the wafer 110 may be moved to successive grinding stations with grinding wheels of decreasing grain size and abrasiveness so that the roughness of the back surface 114 is successively decreased. As such, the wafer 110 is thinned to a predetermined thickness 168 (FIG. 7) of less than about 12 mils and, preferably, the wafer is thinned to between about 6 mils and about 12 mils, although the wafer may be thinned to any desired thickness, such as less than 6 mils.

According to the present invention, it is well appreciated that the planarity of the outer surface 138 of the adhesive tape 130 provides sufficient suction force to be applied on the suction surface 152 of the wafer mounting chuck 150 and on the wafer 110 to undergo grinding without damaging the wafer 110 or without wafer movement. Further, the increased application of a suction force that the adhesive tape 130 provides allows thinning of the wafer 10 to the predetermined thickness 168 after being bumped.

Figure 7:
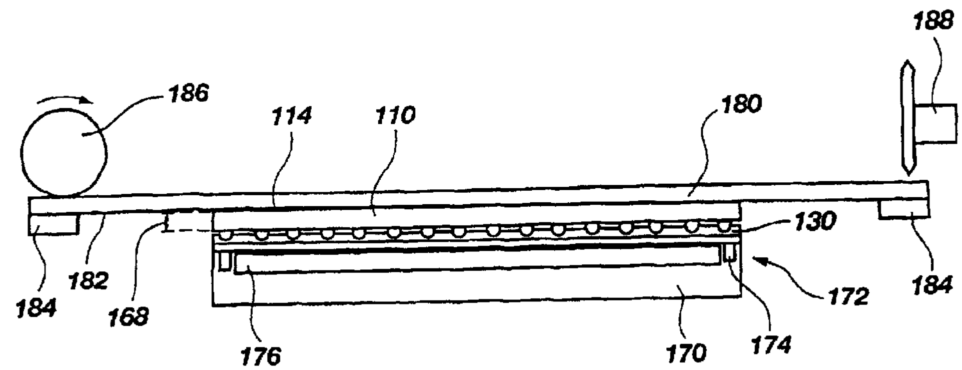

After backgrinding the wafer 110, the wafer 110 may remain on the wafer mounting chuck 150 or be moved to another type of wafer mount chuck 170, such as a chuck 170 with vacuum ports 174 about a chuck periphery 172 and an air gap 176 at a center portion of the chuck 170 (as shown in drawing FIG. 7). As such, the wafer 110 is suctioned to the wafer mount chuck 170 via the vacuum ports 174 with the back surface 114 of the wafer 110 exposed. A wafer mount tape 180 having an adhesive surface 182 is then applied to the back surface 114 of the wafers 110 and to a film frame 184. A lamination roller 186 may be provided to aid in the adhesive attachment of the wafer mount tape 180 to the back surface 114 of the wafer 110 by simply rolling the lamination roller 186 thereon. In the case of the wafer 110 being placed on the chuck 170 having an air gap 176, air pressure is provided in the air gap 176 to prevent the lamination roller 186 from cracking, breaking or causing fatigue to the wafer 110. Any excess wafer mount tape 180 may then be removed using a tape blade 188 or any well-known removing device used in the art.

Figure 8:
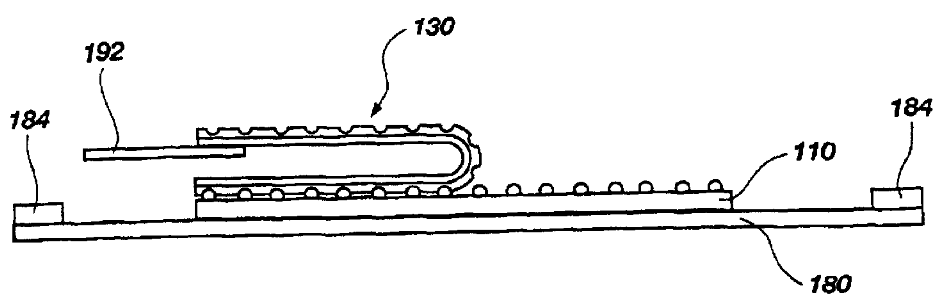

As illustrated in drawing FIG. 8, the wafer 110 is removed from the wafer mount chuck 170 in preparation for removing the adhesive tape 130. Removing the adhesive tape 130 may be accomplished using "de-tape" 192, which has a stronger adhesive than that of the adhesive tape 130. As such, the de-tape 192 may be attached to an end portion of the adhesive tape 130 to peel the adhesive tape 130 from the front surface 112 of the wafer 110. As previously set forth, after removing the adhesive tape 130, it is desirable for the adhesive 132 on the adhesive tape 130 to leave a nonconductive ash through oxidation or burning to prevent any potential problems of the electrical connections with any portion of the wafer 110 and the individual integrated circuit dice 116.

Figure 9:
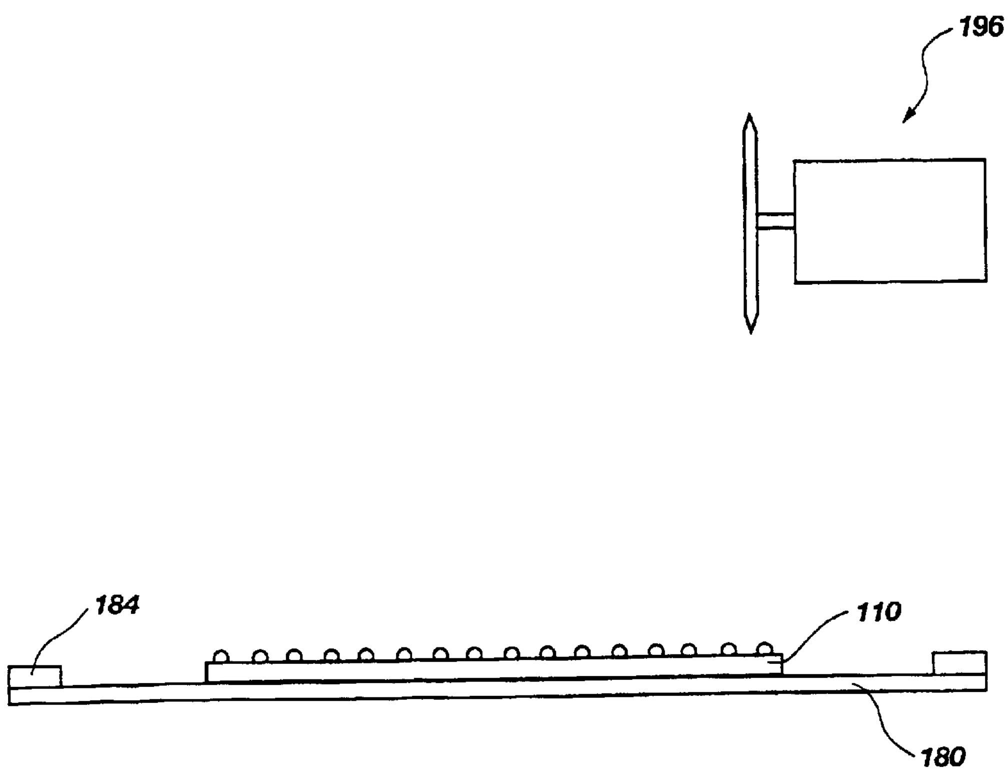

The wafer 110 with the wafer mount tape 180 on its back surface 114 is then prepared for dicing or a singulating process. As illustrated in drawing FIG. 9, the wafer 110 is sitting with its bumps exposed to the dicing apparatus 196. As such, the wafer 110 is diced along the street indices or streets 118 (see FIG. 1) into individual integrated circuit dice 116 by the dicing apparatus 196. After dicing, the wafer mount tape 180 on the back surface 114 of each of the segment intergrated circuit dice 116 may be removed therefrom by suitable pick and place equipment (not shown) in preperation for further processing of the integrated circuit dice 116.

The above descriptions and drawings are only illustrative of preferred embodiments which achieve the objects, features and advantages of the present invention, and it is no intended that the present invention be limited thereto. Any modification of the present invention which comes within the spirit and scope of the following claims is considered part of the present invention.

What is claimed is:

1. A method of attaching a wafer having bumps on a surface thereof, comprising:

attaching a tape having an adhesive and a backing on to solely a portion of said bumps of said surface having bumps thereon of said wafer;

conforming at least a portion of said adhesive of said tape to said bumps, said backing of said tape has a substanially planar surface after said conforming;

providing a wafer mount having a suction surface;

applying a suction force to said backing of said tape;

removing wafer material from a back surface of said wafer while applying said suction force; and cutting said wafer to form at least one semiconductor die after said removing wafer material from said back surface.

2. The method of claim 1, removing said adhesive from said wafer prior to said cutting.

3. The method of claim 1, wherein said applying said suction force to said backing of said tape comprises applying a suction force to said substanially planar surface of said backing.

4. The method of claim 1, wherein said applying said suction for to said backing of said tape includes abutting said backing to said suction surface of said wafer mount.

5. The method of claim 1, wherein said wafer comprises a wafer having a thickness of at least about 12 mils.

6. The method of claim 1, wherein said removing comprises thinning said wafer to a thickness in a range of between about 6 mils and about 12 mils.

7. The method of claim 1, wherein said removing comprises thinning said wafer to one of about 6 mils thickness and less than about 6 mils thickness.

8. The method of claim 1, wherein said removing comprises grinding said back surface of said wafer.

9. The method of claim 1, wherein said removing comprises thinning said wafer by chemical-mechanical polishing said back surface of said wafer.

10. A method of holding a wafer having bumps on at least a portion of a surface thereof, comprising:

applying an adhesive to solely a portion of said bumps on said surface of said wafer;

attaching a backing to at least a portion of said adhesive;

conforming at least a portion of said adhesive of said tape to said bumps, said backing of said tape has a substanially planar surface after said conforming;

providing a wafer mount having a suction surface;

holding said backing to said suction surface of said wafer mount using a suction force; removing wafer material from another surface of said wafer while holding said backing to said suction surface; and cutting said wafer to form at least one semiconductor die after said removing wafer material from said another surface.

11. The method of claim 10, further comprising:

removing said adhesive from said wafer prior to said cutting.

12. The method of claim 10, wherein said holding said backing to said suction surface of said wafer mount comprises applying said suction force to said substantially planar surface of said backing.

13. The method of claim 10, wherein said holding said backing to said suction surface of said wafer mount comprises abutting at least a portion of said backing to said suction surface of said wafer mount.

14. The method of claim 10, wherein said wafer comprises a wafer having a thickness of at least about 12 mils.

15. The method of claim 10, wherein said removing comprises thinning said wafer to a thickness in a range of about 6 mils to about 12 mils.

16. The method of claim 10, wherein said removing comprises thinning said wafer to one of a thickness of about 6 mils and a thickness of about less than 6 mils.

17. The method of claim 10, wherein said removing comprises grinding said another surface of said wafer.

18. The method of claim 10, wherein said removing comprises thinning said wafer by chemical-mechanical polishing said another surface of said wafer.

19. A method of thinning a wafer comprising:

providing a wafer having bumps on at least a portion of a surface thereof;

attaching an adhesive having a backing to solely a portion of said bumps on said surface of said wafer;

conforming at least a portion of said adhesive of said tape to said bumps, said backing of said tape has a substantially planar surface after said conforming;

providing a wafer mount having a suction surface;

attaching said backing of said adhesive to at least a portion of said suction surface of said wafer mount using a suction force;

removing wafer material from another surface of said wafer while said backing of said adhesive attached to at least a portion of said suction surface; and cutting said wafer to form at least one semiconductor die after said removing wafer material from said another surface.

20. The method of claim 19, wherein said attaching said backing to at least a portion of said suction surface of said wafer mount comprises applying said suction force to said substantially planar surface of said backing.

21. The method of claim 19, wherein said attaching said backing to at least a portion of said suction surface of said wafer mount comprises abutting at least a portion of said backing to said at least a portion of said suction surface and wherein said suction force attaches said wafer to said wafer mount.

22. The method of claim 19, wherein said wafer comprises a wafer having a thickness of at least about 12 mils.

23. The method of claim 19, wherein said removing comprises thinning said wafer to a thickness in a range of between about 6 mils and about 12 mils.

24. The method of claim 19, wherein said removing comprises thinning said wafer to one of about 6 mils and less than about 6 mils.

25. The method of claim 19, wherein said removing comprises grinding said another surface of said wafer.

26. The method of claim 19, wherein said removing comprises thinning said wafer by chemical-mechanical polishing said another surface of said wafer.

27. A method of fabricating a wafer having a front surface having bumps thereon and a back surface, comprising:

applying an adhesive having a backing onto solely a portion of said bumps;

conforming at least a portion of said adhesive of said tape to said bumps, said backing of said tape has a substantially planar surface after said conforming;

providing a wafer mount having a suction surface;

attaching at least a portion of said backing to at least a portion of said suction surface of said wafer mount using a suction force;

removing wafer material from said back surface of said wafer while said at least a portion of said backing attached to at least a portion of said suction surface; and cutting said wafer to form at least one semiconductor die after said removing wafer material from said back surface.

28. The method of claim 27, wherein said attaching at least a portion of said backing to at least a portion of said suction surface of said wafer mount comprises applying said suction force to at least a portion of said substantially planar surface of said backing.

29. The method of claim 27, wherein said attaching at least a portion of said backing to at least a portion of said suction surface of said wafer mount comprises abutting at least a portion of said backing to said suction surface and wherein said suction force to attach said wafer to said wafer mount.

30. The method of claim 27, wherein said wafer comprises a wafer having a thickness of at least about 12 mils.

31. The method of claim 27, wherein said removing comprises thinning said wafer to a thickness in a range of between about 6 mils and about 12 mils.

32. The method of claim 27, wherein said removing comprises thinning said wafer to a thickness of one of about 6 mils and less than about 6 mils.

33. The method of claim 27, wherein said removing comprises grinding said back surface of said wafer.

34. The method of claim 27, wherein said removing comprises thinning said wafer by chemical-mechanical polishing said back surface of said wafer.

35. The method of claim 27, further comprising: removing said adhesive from said wafer.

36. The method of claim 35, wherein said cutting said wafer comprises forming a plurality of semiconductor dies.

37. A method of mounting a bumped wafer having bumps on at least a portion of a surface thereof to a wafer mounting chuck, comprising:

applying an adhesive having a backing to solely a portion of said bumps;

conforming at least a portion of said adhesive of said tape to said bumps, said backing of said tape has a substantially planar surface after said conforming;

mounting said wafer to said wafer mounting chuck using a suction force communicated through said wafer mounting chuck;

removing wafer material from a back surface of said wafer while said wafer mounted to said wafer mounting chuck; and cutting said wafer to form at least one semiconductor die after said removing wafer material from said back surface.

38. The method of claim 37, wherein said mounting said wafer to said wafer mounting chuck comprises applying said suction force to at least a portion of said substantially planar surface.

39. The method of claim 37, wherein said mounting said wafer to said wafer mounting chuck comprises abutting at least a portion of said backing to a suction surface of said wafer mounting chuck.

40. The method of claim 37, wherein said wafer comprises a wafer having a thickness of at least about 12 mils.

41. A method of using a vacuum to hold a bumped wafer having a front surface having bumps thereon and a back surface, comprising:

applying an adhesive having a backing to solely a portion of said front surface of said wafer covering a portion of at least one bump of said bumps thereon;

conforming at least a portion of said adhesive of said tape to said bumps, said backing of said tape has a substantially planar surface after said conforming;

holding at least a portion of said front surface of said wafer using a vacuum applied through at least a portion of a surface of a wafer mount;

removing wafer material from a back surface of said wafer while holding said at least a portion of said first surface of said wafer using said vacuum; and cutting said wafer to form at least one semiconductor die after said removing wafer material from said back surface.

42. The method of claim 41, wherein said holding comprises applying said vacuum to said substantially planar surface of said backing.

43. The method of claim 41, wherein said holding comprises abutting at least a portion of said backing to said surface of the wafer mount and wherein said vacuum holds said wafer to said wafer mount.

44. The method of claim 41, wherein said wafer comprises a wafer having a thickness of at least about 12 mils.

45. A method of attaching a wafer having bumps on a surface thereof, comprising:

attaching a tape having an adhesive and a backing on at least a portion of said surface having bumps thereon of said wafer, said tape contacting about 10% to about 60% of the surface area of said bumps;

conforming at least a portion of said adhesive of said tape to said bumps, said backing of said tape having a substantially planar surface after said conforming;

providing a wafer mount having a suction surface;

applying a suction force to said backing of said tape;

removing wafer material from a back surface of said wafer while applying said suction force; and cutting said wafer to form a plurality of semiconductor dies after removing said wafer material from said back surface.

46. The method of claim 45, further comprising: removing said adhesive from said wafer prior to said cutting.

47. The method of claim 45, wherein said applying said suction force to said backing of said tape comprises applying a suction force to said substantially planar surface of said backing.

48. The method of claim 45, wherein said applying a suction force to said backing of said tape includes abutting said backing to said suction surface of said wafer mount.

49. The method of claim 45, wherein said wafer comprises a wafer having a thickness of at least about 12 mils.

50. The method of claim 46, wherein said removing comprises thinning said wafer to a thickness in a range of between about 6 mils and about 12 mils.

51. The method of claim 46, wherein said removing comprises thinning said wafer to one about 6 mils thickness and less than about 6 mils thickness.

52. The method of claim 46, wherein said removing comprises grinding said back surface of said wafer.

53. The method of claim 46, wherein said removing comprises thinning said wafer by chemical-mechanical polishing said back surface of said wafer.

* * * * *